US012652998B2

(12) United States Patent
Kim et al.

(10) Patent No.:   US 12,652,998 B2
(45) Date of Patent:       Jun. 9, 2026

(54) APPARATUS FOR PROCESSING SUBSTRATE

(71) Applicant: SAMSUNG ELECTRONICS CO., LTD., Suwon-si (KR)

(72) Inventors: Yeontae Kim, Suwon-si (KR); Yihwan Kim, Suwon-si (KR); Woohyung Kim, Suwon-si (KR); Sunwoo Bang, Suwon-si (KR); Kwanghyun Yang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 79 days.

(21) Appl. No.: 18/904,870

(22) Filed: Oct. 2, 2024

(65) Prior Publication Data

US 2025/0140595 A1     May 1, 2025

(30) Foreign Application Priority Data

Oct. 26, 2023     (KR) ........................ 10-2023-0144685

(51) Int. Cl.
*H01J 37/32*     (2006.01)
*H10P 72/76*     (2026.01)
*H10P 72/00*     (2026.01)

(52) U.S. Cl.
CPC ...... *H10P 72/7612* (2026.01); *H01J 37/3244* (2013.01); *H01J 37/32724* (2013.01); *H01J 2237/3321* (2013.01); *H01J 2237/3341* (2013.01); *H10P 72/0432* (2026.01)

(58) Field of Classification Search
CPC ............. H01J 37/3244; H01J 37/32449; H01J 37/32724; H01J 37/32743; H01J 2237/3321; H01J 2237/3341; H01L 21/67103; H01L 21/68742
See application file for complete search history.

(56) References Cited

U.S. PATENT DOCUMENTS

| | | | |
|---|---|---|---|
| 11,887,811 B2* | 1/2024 | Paul ..................... | C23C 16/503 |
| 2015/0236566 A1 | 8/2015 | Yudovsky et al. | |
| 2019/0051555 A1 | 2/2019 | Hill et al. | |
| 2020/0035522 A1 | 1/2020 | Nguyen et al. | |
| 2021/0285105 A1 | 9/2021 | Lau et al. | |
| 2022/0076920 A1* | 3/2022 | Paul .................... | H01L 21/6831 |

(Continued)

FOREIGN PATENT DOCUMENTS

| | | |
|---|---|---|
| KR | 10-2007-0045526 A | 5/2007 |
| KR | 10-1356537 B1 | 1/2014 |

(Continued)

*Primary Examiner* — Tung X Le
(74) *Attorney, Agent, or Firm* — Sughrue Mion, PLLC

(57)          ABSTRACT

An apparatus for processing a substrate is provided and includes: a chamber including an internal space; a shower head in the internal space of the chamber; a heater below the shower head; lift pins configured to lift the substrate, relative to the heater, while the substrate is on the heater; a rotation shaft connected to the heater; a rotation driving actuator connected to the rotation shaft and configured to rotate the heater by rotating the rotation shaft; a first lifting driving actuator configured to lift the heater; a lifting member configured to lift the lift pins; and a second lifting driving actuator connected to the lifting member and configured to lift the lift pins, relative to the heater, by lifting the lifting member.

20 Claims, 7 Drawing Sheets

100

(56)                    References Cited

U.S. PATENT DOCUMENTS

| 2022/0084798 A1* | 3/2022 | Iizuka | ............... | H01J 37/32449 |
| 2022/0262604 A1* | 8/2022 | Ohashi | ................... | C23C 16/46 |
| 2025/0201532 A1* | 6/2025 | Iizuka | ................... | H01L 21/31 |
| 2025/0232962 A1* | 7/2025 | Tanaka | ................... | H05B 3/28 |

FOREIGN PATENT DOCUMENTS

| KR | 10-1810142 B1 | 12/2017 |
| KR | 10-2019-0016433 A | 2/2019 |
| KR | 10-2023-0029729 A | 3/2023 |

* cited by examiner

100

APPARATUS FOR PROCESSING SUBSTRATE

CROSS-REFERENCE TO RELATED APPLICATION

This application claims benefit of priority to Korean Patent Application No. 10-2023-0144685, filed on Oct. 26, 2023 in the Korean Intellectual Property Office, the entire content of which is incorporated herein by reference.

BACKGROUND

1. Technical Field

Embodiments of the present discourse relate to an apparatus for processing a substrate, and a method of operating the apparatus.

2. Brief Description of Related Art

In general, among technologies for forming various thin films on a substrate or a wafer, a chemical vapor deposition (CVD) method is widely used. The chemical vapor deposition method is a deposition technology which involves a chemical reaction, and a semiconductor thin film, an insulating film, or the like, is formed on a surface of the wafer using a chemical reaction of a source material by the chemical vapor deposition method.

Currently, the chemical vapor deposition method is used to deposit various thin films such as a silicon film, an oxide film, a silicon nitride film, a silicon oxynitride film, a tungsten film, or the like, on the wafer.

Meanwhile, the assistance of appropriate ions is required during a deposition process, and radicals are required during an etching or annealing process. In addition, high temperatures are required to improve deposition characteristics, and low temperatures are required to improve etching rates.

As described above, the process should be performed at various temperatures to deposit various thin films, and the process should be performed in various atmospheres for deposition and etching processes with the assistance of ions and radicals.

To this end, there is a need to develop a structure for an apparatus for processing a substrate.

SUMMARY

According to embodiments of the present disclosure, an apparatus for processing a substrate in which a process may be performed at various temperatures and in various atmospheres is provided.

According to embodiments of the present disclosure, an apparatus for processing a substrate is provided and includes: a chamber including an internal space; a shower head in the internal space of the chamber; a heater below the shower head; lift pins configured to lift the substrate, relative to the heater, while the substrate is on the heater; a rotation shaft connected to the heater; a rotation driving actuator connected to the rotation shaft and configured to rotate the heater by rotating the rotation shaft; a first lifting driving actuator configured to lift the heater; a lifting member configured to lift the lift pins; and a second lifting driving actuator connected to the lifting member and configured to lift the lift pins, relative to the heater, by lifting the lifting member.

According to embodiments of the present disclosure, an apparatus for processing a substrate is provided and includes: a chamber including an internal space; a shower head in the internal space of the chamber; a heater below the shower head; lift pins configured to lift the substrate, relative to the heater, while the substrate is on the heater; a rotation shaft connected to the heater; a rotation driving actuator connected to the rotation shaft and configured to rotate the heater by rotating the rotation shaft; a first lifting driving actuator configured to lift the heater; a lifting member configured to lift the lift pins; and a second lifting driving actuator connected to the lifting member and configured to lift the lift pins, relative to the heater, by lifting the lifting member, wherein the rotation driving actuator is configured to rotate the heater while processing is performed on the substrate, wherein the first lifting driving actuator is configured to adjust a position of the heater, and wherein the second lifting driving actuator is configured to adjust a degree of separation of the substrate from the heater by lifting the lift pins.

According to embodiments of the present disclosure, a method of processing a substrate within an apparatus that includes a chamber including an internal space, a shower head in the internal space, and a heater below the shower head, is provided. The method includes: mounting the substrate on the heater; adjusting, by at least one from among a first lifting driving actuator and a second lifting driving actuator of the apparatus, a position of the heater or the substrate based on a type of processing to be performed on the substrate by the apparatus; performing the processing on the substrate while rotating the heater by a rotation driving actuator connected to the heater via a rotation shaft, wherein the first lifting driving actuator is configured to lift the heater, and wherein the second lifting driving actuator is connected to a lifting member that is connected to lift pins, and the second lifting driving actuator is configured to lift the substrate, relative to the heater, by causing the lift pins to lift, relative to the heater, by lifting the lifting member.

BRIEF DESCRIPTION OF DRAWINGS

The above and other aspects, features, and advantages of embodiments of the present disclosure will be more clearly understood from the following detailed description, taken in conjunction with the accompanying drawings.

DETAILED DESCRIPTION

Hereinafter, non-limiting example embodiments of the present disclosure will be described with reference to the accompanying drawings.

It will be understood that when an element is referred to as being "on," "connected to," or "coupled to" another element, it can be directly on, connected to, or coupled to the other element or intervening elements may be present. In contrast, when an element is referred to as being "directly on," "directly connected to," or "directly coupled to" another element, there are no intervening elements present.

Figure 1:
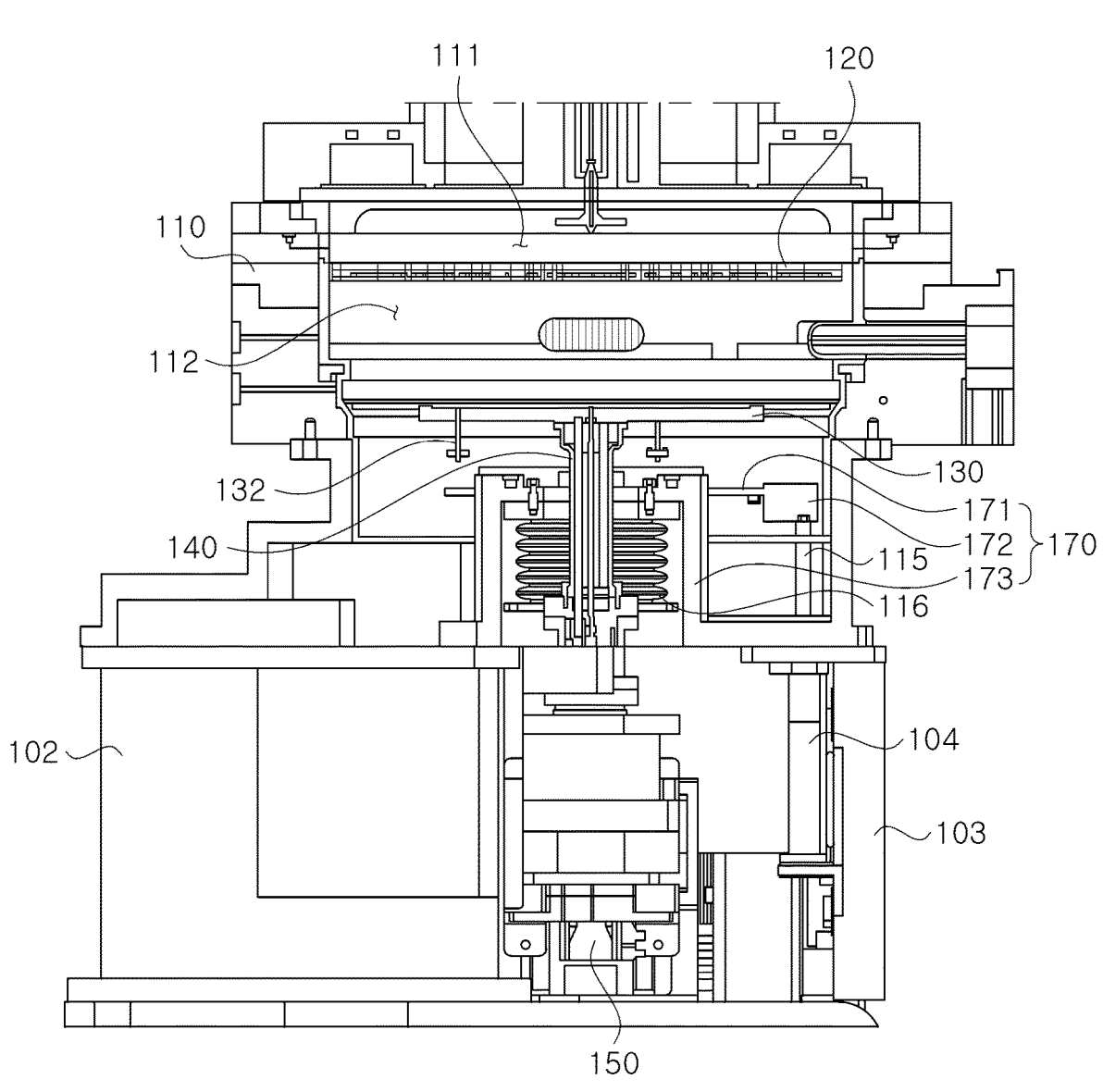
FIG. 1 is a schematic configuration diagram illustrating an apparatus for processing a substrate according to an example embodiment.
Figure 2:
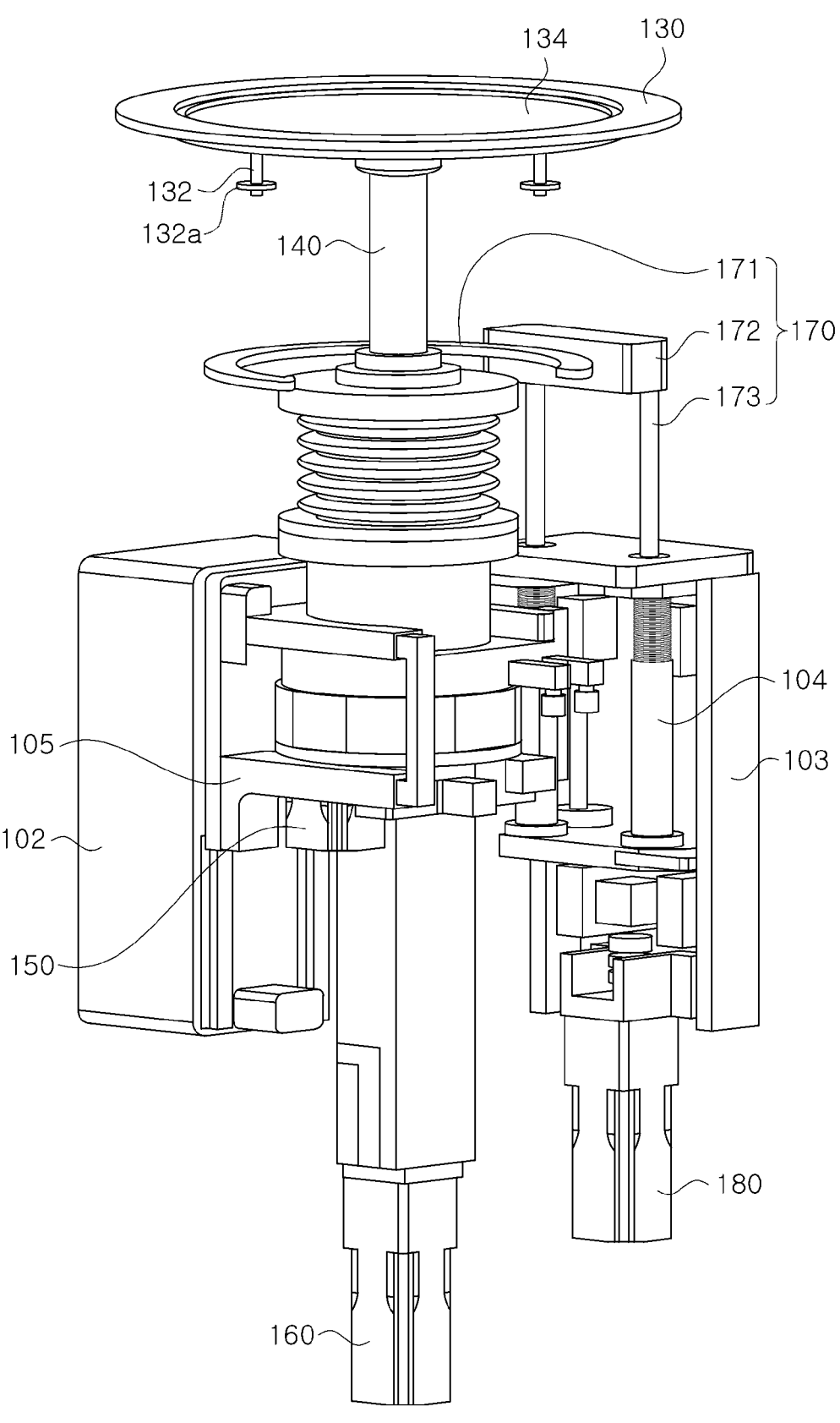
FIG. 2 is a perspective view illustrating a partial configuration of an apparatus for processing a substrate according to an example embodiment.

FIG. 1 is a schematic configuration diagram illustrating an apparatus for processing a substrate according to an example embodiment, and FIG. 2 is a perspective view illustrating a partial configuration of an apparatus for processing a substrate according to an example embodiment.

Referring to FIGS. 1 and 2, an apparatus 100 for processing a substrate W (refer to FIGS. 3-7) according to an example embodiment includes a chamber 110, a shower head 120, a heater 130, a rotation shaft 140, a rotation driving unit 150 (also referred to as a "rotation driving actuator"), a first lifting driving unit 160 (also referred to as a "first driving actuator"), a lifting member 170, and a second lifting driving unit 180 (also referred to as a "second lifting driving actuator").

The chamber 110 has an internal space in which the substrate is accommodated so that one of deposition, etching, and annealing processes may be performed thereon. The shower head 120 may be disposed in the internal space of the chamber 110. A plurality of supply passages may be provided on a side wall of the chamber 110 to allow a plurality of process gases to flow into the internal space of the chamber 110. The internal space of the chamber 110 may be provided with a plasma region 111 disposed above the shower head 120 and a process region 112 disposed below the shower head 120. As an example, a main body 102 may be provided below the chamber 110. The main body 102 may be provided with a first installation frame portion 103 on which the lifting member 170 is installed, and the first installation frame portion 103 may be provided with a guide rod 104 into which a portion of the lifting member 170 is inserted and installed.

In addition, the chamber 110 may be provided with a cylindrical portion 115 disposed so that the rotation shaft 140 penetrates therethrough, and a bellows pipe 116 disposed to surround a lower end portion of the rotation shaft 140 may be installed inside the cylindrical portion 115.

The shower head 120 is installed in the internal space of the chamber 110, and divides the internal space of the chamber 110 into the plasma region 111 and the process region 112. Plasma generated in the plasma region 111 passes through the shower head 120 and is supplied to the process region 112. To this end, the shower head 120 may be provided with a plurality of openings.

The heater 130 may be provided with lift pins 132 for lifting a mounted substrate disposed below the shower head 120, for example, a wafer. As an example, the heater 130 may have a disk shape, and may be provided with a heating member 134 generating heat. Meanwhile, the heater 130 may be connected to the rotation driving unit 150 and rotated. In addition, the heater 130 may be connected to the first lifting driving unit 160 and may be lifted. As described above, since the heater 130 is connected to the rotation driving unit 150 and the first lifting driving unit 160, the heater 130 may be rotated during a process and a position of the heater 130 may be changed depending on the process. The lift pins 132 may be disposed to penetrate the heater 130 and may be lifted relative to the heater 130. For example, top ends of the lift pins 132, that contact a bottom surface of the substrate, may move upwards relative to the heater 130 such that the top ends of the lift pins 132 are above the heater 130 a certain distance, thereby causing the substrate to move upwards such as to be spaced apart from the heater by the certain distance. According to an example embodiment, the lift pins 132 may be provided with one or more locking protrusions 132a to prevent the lift pins 132 from being separated from the heater 130. Meanwhile, the lift pins 132 may be disposed to be spaced apart from each other in a circumferential direction, which is a direction in which the heater 130 rotates along an outer peripheral surface. As an example, three lift pins 132 may be disposed to be spaced apart from each other. However, embodiments of the present disclosure are not limited thereto, and four or more lift pins 132 may be provided.

The rotation shaft 140 may be connected to the heater 130, and may penetrate the cylindrical portion 115 of the chamber 110 and be connected to the rotation driving unit 150. As described above, since the heater 130 is connected to the rotation driving unit 150 through the rotation shaft 140, the heater 130 may be rotated during the process.

The rotation driving unit 150 is connected to the rotation shaft 140 and serves to rotate the heater 130 in conjunction with the rotation shaft 140. As an example, the rotation driving unit 150 may be a rotation motor. In addition, the rotation driving unit 150 may be installed on a second installation frame 105 provided on the main body 102 disposed below the chamber 110. Meanwhile, the rotation driving unit 150 may be connected to the rotation shaft 140 through a power transmission member.

The first lifting driving unit 160 may be installed in the chamber 110 to be disposed below the rotation driving unit 150. Meanwhile, the first lifting driving unit 160 may be connected to the rotation shaft 140. As an example, the first lifting driving unit 160 may be a linear motor or a cylinder for lifting the rotation shaft 140.

The lifting member 170 is lifted to lift the lift pins 132. As an example, the lifting member 170 may be connected to the second lifting driving unit 180 to be lifted. The lifting member 170 may include a contact portion 171 having a circular ring shape with an open region, a connection portion 172 connected to the contact portion 171, and a lifting unit 173 (also referred to as a "lifting body"), lifted by the second lifting driving unit 180. As an example, the contact portion 171 contacts the locking protrusions 132a of the lift pins 132 to allow the lift pins 132 to be lifted. To this end, the contact portion 171 has a circular ring shape with an open region so that the lift pins 132 may be raised simultaneously when lifting. The lifting unit 173 may be installed to be able to enter and exit the guide rod 104. As described above, when the lifting unit 173 is lifted along the guide rod 104, the contact portion 171 connected to the lifting unit 173 through the connection portion 172 may be lifted together with the lifting unit 173.

The second lifting driving unit 180 is connected to the lifting member 170 and serves to lift the lifting member 170. As an example, the second lifting driving unit 180 may be installed on the first installation frame portion 103. The second lifting driving unit 180 may be, for example, a linear motor or a cylinder.

As described above, the heater 130 on which a substrate (e.g., wafer) is mounted may be rotated by the rotation driving unit 150 during a process. In addition, as the heater 130 on which the substrate (e.g., wafer) is mounted is lifted by the first lifting driving unit 160, the substrate may be positioned in different positions, depending on the process. Furthermore, the substrate may be disposed to be spaced apart from the heater 130 by a certain distance by the second lifting driving unit 180 lifting the lift pins 132. Accordingly, the temperature of the substrate (e.g., wafer) may be temporarily reduced during the process.

In more detail, during a deposition process, energy from electrons and radicals alone may be insufficient, so the assistance of ion energy may be needed. The substrate (e.g., wafer) may need to be rotated so that ion energy passing through the shower head 120 is evenly transferred to the substrate (e.g., wafer). To this end, the rotation driving unit 150 rotates the heater 130 so that the ion energy may be evenly transferred to the substrate.

In addition, since the ion energy may be required to be controlled according to chemical substances during the deposition process, the heater 130 may be moved by the first lifting driving unit 160 so that the substrate (e.g., wafer) is disposed in a predetermined position.

Furthermore, high temperature may be required for hydrogen (H₂) desorption and low temperature may be required to improve radical life. According to these situational conditions, since a separation distance between the substrate and the heater 130 may be required to be controlled, the lift pins 132 may be lifted via the second lifting driving unit 180 to control the separation distance between the substrate and the heater 130.

Hereinafter, an operation of an apparatus for processing a substrate will be described with reference to the drawings.

FIGS. 3 to 7 are explanatory diagrams for illustrating an operation of an apparatus for processing a substrate according to an example embodiment.

Figure 3:
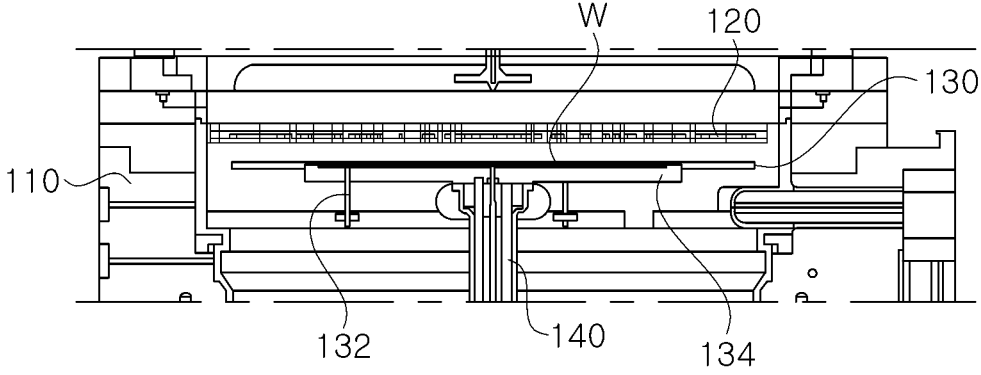
FIGS. 3 to 7 are explanatory diagrams for illustrating an operation of an apparatus for processing a substrate according to an example embodiment.

When processing a substrate W (e.g., a wafer) when ion energy and high temperature are required for processing the substrate W, as shown in FIG. 3, a heater 130 may be disposed adjacent to a lower portion of the shower head 120 in a state in which the substrate W is mounted on the heater 130. In this case, the process may be performed in a state in which the heater 130 is rotated by the rotation driving unit 150 (see FIG. 2).

Figure 4:
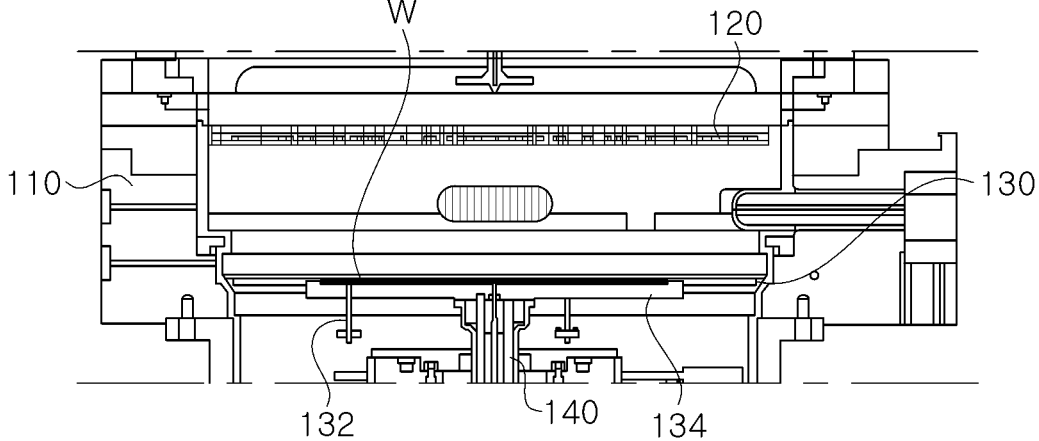

When processing a substrate W (e.g., a wafer) when radicals and high temperature are required for processing the substrate W, as shown in FIG. 4, the heater 130 may be disposed adjacent to the cylindrical portion 115 of the chamber 110 in a state in which the substrate W is mounted on the heater 130. In this case, the process may be performed in a state in which the heater 130 is rotated by the rotation driving unit 150 (see FIG. 2).

Figure 5:
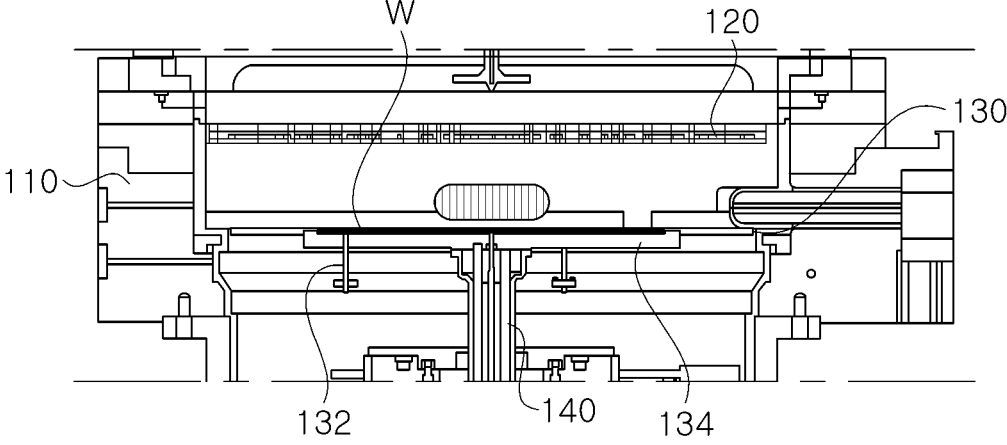

In addition, when processing a substrate W (e.g., a wafer) when ion energy, radicals, and high temperature are required for processing the substrate W, as shown in FIG. 5, the heater 130 may be disposed in a middle region at a position in which the heater 130 in FIGS. 3 and 4 is disposed in a state in which the substrate W is mounted. In this case, the process may be performed in a state in which the heater 130 is rotated by the rotation driving unit 150 (see FIG. 2).

Figure 6:
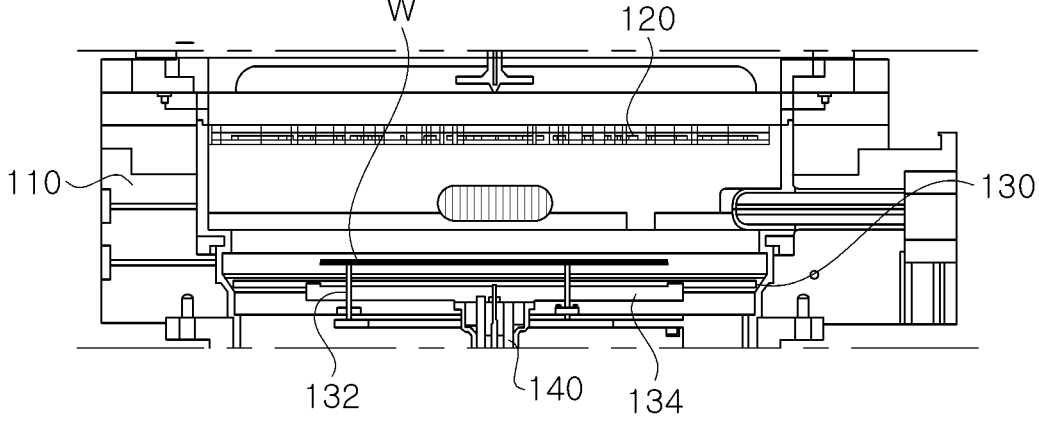

When processing a substrate W (e.g., a wafer) when radicals and low temperature are required for processing the substrate W, as shown in FIG. 6, the heater 130 may be disposed adjacent to the cylindrical portion 115 of the chamber 110 in a state in which the substrate W is mounted. In addition, the substrate W may be disposed to be spaced apart from the heater 130 by a predetermined distance by the lift pins 132 raised via the second lifting driving unit 180 (see FIG. 2). In this case, the process may be performed in a state in which the heater 130 is rotated by the rotation driving unit 150 (see FIG. 2).

Figure 7:
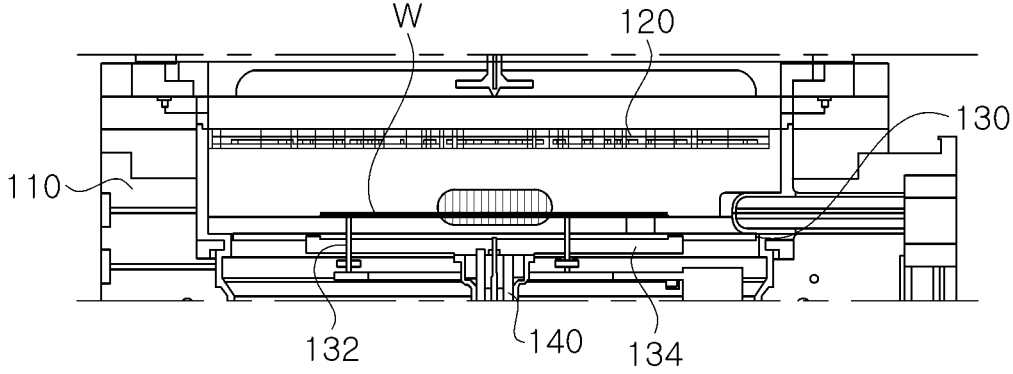

When processing a substrate W (e.g., a wafer) when ion energy, radicals, and low temperature are required for processing the substrate W, as shown in FIG. 7, the heater 130 may be disposed at the same position as the heater 130 in FIG. 5 in a state in which the substrate W is mounted. In addition, the substrate W may be disposed to be spaced apart from the heater 130 by a predetermined distance by the lift pins 132 raised via the second lifting driving unit 180 (see FIG. 2). In this case, the process may be performed in a state in which the heater 130 is rotated by the rotation driving unit 150 (see FIG. 2).

As described above, the process may be performed by rotating the substrate W while positioning the substrate W, for example, a wafer, to suit each condition.

According to embodiments of the present disclosure, the apparatus 100 may include a controller configured to cause the apparatus 100 to perform its functions. For example, the controller may be configured to cause the rotation driving unit 150 to rotate the heater 130, the first lifting driving unit 160 to lift the heater 130 by lifting the rotation shaft 140, the second lifting driving unit 180 to lift the substrate W (e.g., to be spaced apart from the heater 130 by a predetermined distance) by lifting the lifting member 170 and the lift pins 132, and/or the heater 130 to heat, in accordance with the specific process to be performed. For example, the controller may be configured to control components (e.g., the heater 130, the first lifting driving unit 160, the second lifting driving unit 180, and/or the heater 130) of the apparatus 100 such as to cause the operations described above with reference to FIGS. 3-7 to be performed based on the specific process to be performed.

As set forth above, an apparatus for processing a substrate in which a process may be performed at various temperatures and in various atmospheres may be provided.

The various and advantageous advantages and effects of embodiments of the present disclosure are not limited to the above description, and may be more easily understood in the course of describing non-limiting example embodiments of the present disclosure. While example embodiments have been shown and described above, it will be apparent to those skilled in the art that modifications and variations could be made without departing from the scope of the present disclosure.

What is claimed is:

1. An apparatus for processing a substrate, the apparatus comprising:
    a chamber comprising an internal space;
    a shower head in the internal space of the chamber;
    a heater below the shower head;
    lift pins configured to lift the substrate, relative to the heater, while the substrate is on the heater;
    a rotation shaft connected to the heater;
    a rotation driving actuator connected to the rotation shaft and configured to rotate the heater by rotating the rotation shaft;
    a first lifting driving actuator configured to lift the heater;
    a lifting member configured to lift the lift pins; and
    a second lifting driving actuator connected to the lifting member and configured to lift the lift pins, relative to the heater, by lifting the lifting member.

2. The apparatus of claim 1, wherein the lifting member comprises:
    a contact portion having a circular ring shape, the contact portion configured to contact the lift pins;
    a connection portion connected to the contact portion; and
    a lifting body connected to the contact portion via the connection portion, the lifting body configured to be lifted by the second lifting driving actuator such that the contact portion is lifted.

3. The apparatus of claim 2, wherein the lift pins are spaced apart from each other in a circumferential direction of the heater, and
    wherein the lift pins comprise a locking protrusion, and the lift pins are configured to be lifted by the contact portion contacting the locking protrusion.

4. The apparatus of claim 2, further comprising a main body that is below the chamber, the main body comprising a first installation frame portion on which the lifting member is installed, wherein the first installation frame portion comprises a guide rod that contains a portion of the lifting body.

5. The apparatus of claim 4, wherein the main body comprises a second installation frame portion that is below the chamber and includes the rotation driving actuator.

6. The apparatus for processing a substrate of claim 1, wherein the chamber comprises:

a cylindrical portion through which the rotation shaft penetrates; and a bellows pipe that is within the cylindrical portion and surrounds a lower end portion of the rotation shaft.

7. The apparatus of claim 1, wherein the internal space of the chamber comprises a plasma region above the shower head and a process region below the shower head.

8. The apparatus for processing a substrate of claim 1, wherein the heater comprises a disk shape and is configured to generate heat.

9. The apparatus for processing a substrate of claim 1, wherein an upper surface of the heater is configured to support the substrate thereon, and the rotation driving actuator is configured to rotate the heater in a case where the substrate is on the upper surface of the heater.

10. The apparatus of claim 1, wherein an upper surface of the heater is configured to support the substrate thereon, and the first lifting driving actuator is configured to lift the heater in a case where the substrate is on the upper surface of the heater.

11. The apparatus for processing a substrate of claim 1, wherein an upper surface of the heater is configured to support the substrate thereon, and the second lifting driving actuator is configured to lift the substrate, by lifting the lift pins, such as to separate the substrate from the upper surface of the heater.

12. An apparatus for processing a substrate, the apparatus comprising:

a chamber comprising an internal space;

a shower head in the internal space of the chamber;

a heater below the shower head;

lift pins configured to lift the substrate, relative to the heater, while the substrate is on the heater;

a rotation shaft connected to the heater;

a rotation driving actuator connected to the rotation shaft and configured to rotate the heater by rotating the rotation shaft;

a first lifting driving actuator configured to lift the heater;

a lifting member configured to lift the lift pins; and a second lifting driving actuator connected to the lifting member and configured to lift the lift pins, relative to the heater, by lifting the lifting member, wherein the rotation driving actuator is configured to rotate the heater while processing is performed on the substrate, wherein the first lifting driving actuator is configured to adjust a position of the heater, and wherein the second lifting driving actuator is configured to adjust a degree of separation of the substrate from the heater by lifting the lift pins.

13. The apparatus for processing a substrate of claim 12, wherein the lifting member comprises:

a contact portion having a circular ring shape, the contact portion configured to contact the lift pins;

a connection portion connected to the contact portion; and a lifting body connected to the contact portion via the connection portion, the lifting body configured to be lifted by the second lifting driving actuator such that the contact portion is lifted.

14. The apparatus for processing a substrate of claim 13, wherein the lift pins are spaced apart from each other in a circumferential direction of the heater.

15. The apparatus for processing a substrate of claim 14, wherein the lift pins comprise a locking protrusion, and the lift pins are configured to be lifted by the contact portion contacting the locking protrusion.

16. The apparatus for processing a substrate of claim 12, wherein the internal space of the chamber comprises a plasma region above the shower head and a process region below the shower head.

17. The apparatus for processing a substrate of claim 12, wherein the heater comprises a disk shape and is configured to generate heat.

18. The apparatus of claim 12, further comprising a main body that is below the chamber, the main body comprising a first installation frame portion on which the lifting member is installed, wherein the first installation frame portion comprises a guide rod that contains a portion of the lifting body.

19. The apparatus of claim 18, wherein the main body comprises a second installation frame portion that is below the chamber and includes the rotation driving actuator.

20. The apparatus for processing a substrate of claim 12, wherein an upper surface of the heater is configured to support the substrate thereon, and the rotation driving actuator is configured to rotate the heater in a case where the substrate is on the upper surface of the heater.

* * * * *